United States Patent
Takagi

(10) Patent No.: US 10,259,216 B2
(45) Date of Patent: Apr. 16, 2019

(54) SEMICONDUCTOR DEVICE, LIQUID DISCHARGE HEAD, LIQUID DISCHARGE HEAD CARTRIDGE, AND PRINTING APPARATUS

(71) Applicant: CANON KABUSHIKI KAISHA, Tokyo (JP)

(72) Inventor: Makoto Takagi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/641,749

(22) Filed: Jul. 5, 2017

(65) Prior Publication Data
US 2018/0015718 A1 Jan. 18, 2018

(30) Foreign Application Priority Data
Jul. 14, 2016 (JP) ................... 2016-139695

(51) Int. Cl.
*B41J 2/045* (2006.01)
*H01L 27/088* (2006.01)
(Continued)

(52) U.S. Cl.
CPC ......... *B41J 2/04541* (2013.01); *B41J 2/0458* (2013.01); *B41J 2/04548* (2013.01);
(Continued)

(58) Field of Classification Search
CPC .............. B41J 2/04541; B41J 2/04586; B41J 2/04581; B41J 2/0458; H01L 23/528; H01L 27/088; H01L 27/092; H01L 27/0922
See application file for complete search history.

(56) References Cited

U.S. PATENT DOCUMENTS 6,491,377 B1 * 12/2002 Cleland ................ B41J 2/04541
347/50
6,586,769 B1   7/2003 Watanabe et al.
(Continued)

FOREIGN PATENT DOCUMENTS

CN    1254187 A    5/2000
CN    1593919 A    3/2005
(Continued)

OTHER PUBLICATIONS

Office Action dated Feb. 11, 2019, in Chinese Patent Application No. 201710558553.2.

*Primary Examiner* — Henok Legesse
(74) *Attorney, Agent, or Firm* — Venable LLP

(57) ABSTRACT

A semiconductor device is provided. The device comprises discharge units each including a discharge element and a driving unit configured to drive the discharge element, and a terminal unit configured to supply power to the discharge units via a wiring line. The discharge units include a first discharge unit including a first discharge element of the discharge elements and a first driving unit of the driving units and a second discharge unit including a second discharge element of the discharge elements and a second driving unit of the driving units. A length of a current path from the terminal unit to the first discharge unit is longer than a length of a current path from the terminal unit to the second discharge unit and a resistance of the first driving unit is lower than a resistance of the second driving unit.

17 Claims, 12 Drawing Sheets

(51) Int. Cl.
 *H01L 23/528* (2006.01)
 *H01L 27/092* (2006.01)
(52) U.S. Cl.
 CPC ....... *B41J 2/04581* (2013.01); *B41J 2/04586* (2013.01); *H01L 27/088* (2013.01); *H01L 23/528* (2013.01); *H01L 27/092* (2013.01); *H01L 27/0922* (2013.01)

(56) References Cited

U.S. PATENT DOCUMENTS

| | | |
|---|---|---|
| 6,712,439 B1 | 3/2004 | Anderson et al. |
| 6,830,307 B2 | 12/2004 | Anderson et al. |
| 6,909,116 B2 | 6/2005 | Watanabe et al. |
| 7,098,481 B2 | 8/2006 | Watanabe et al. |
| 7,125,105 B2 | 10/2006 | Oomura |
| 7,394,101 B2 | 7/2008 | Watanabe et al. |
| 7,888,680 B2 | 2/2011 | Watanabe et al. |
| 9,085,135 B2 * | 7/2015 | Fujii .................... B41J 2/04548 |
| 2018/0015718 A1 | 1/2018 | Takagi |

FOREIGN PATENT DOCUMENTS

| | | |
|---|---|---|
| CN | 1738719 A | 2/2006 |
| CN | 1876377 A | 12/2006 |
| CN | 103802475 A | 5/2014 |
| CN | 107618263 A | 1/2018 |
| JP | 2014-094514 A | 5/2014 |

\* cited by examiner

FIG. 3

| DISCHARGE UNIT NUMBER | RVH[Ω] | RGNDH[Ω] | RON[Ω] | TOTAL[Ω] |
|---|---|---|---|---|
| 1 | 0.2 | 0.1 | 14.25 | 14.55 |
| 2 | 0.3 | 0.15 | 14.1 | 14.55 |
| 3 | 0.4 | 0.2 | 13.95 | 14.55 |
| 4 | 0.5 | 0.25 | 13.8 | 14.55 |
| 5 | 0.6 | 0.3 | 13.65 | 14.55 |
| 6 | 0.7 | 0.35 | 13.5 | 14.55 |
| 7 | 0.8 | 0.4 | 13.35 | 14.55 |
| 8 | 0.9 | 0.45 | 13.2 | 14.55 |
| 9 | 1.0 | 0.5 | 13.05 | 14.55 |
| 10 | 1.1 | 0.55 | 12.9 | 14.55 |
| 11 | 1.2 | 0.6 | 12.75 | 14.55 |
| 12 | 1.3 | 0.65 | 12.6 | 14.55 |
| 13 | 1.4 | 0.7 | 12.45 | 14.55 |
| 14 | 1.5 | 0.75 | 12.3 | 14.55 |
| 15 | 1.6 | 0.8 | 12.15 | 14.55 |
| 16 | 1.7 | 0.85 | 12 | 14.55 |

| SEGMENT NUMBER | RVH[Ω] | RGNDH[Ω] | RON[Ω] | TOTAL[Ω] |
|---|---|---|---|---|
| 1 | 22.8 | 12 | 13.2 | 48 |
| 2 | 23.2 | 12 | 12.8 | 48 |
| 3 | 23.6 | 12 | 12.4 | 48 |
| 4 | 24 | 12 | 12 | 48 |

F I G. 10
| REGION | RON[Ω] |
|---|---|
| A | HIGH |
| B | MEDIUM |
| C | LOW |
F I G. 11
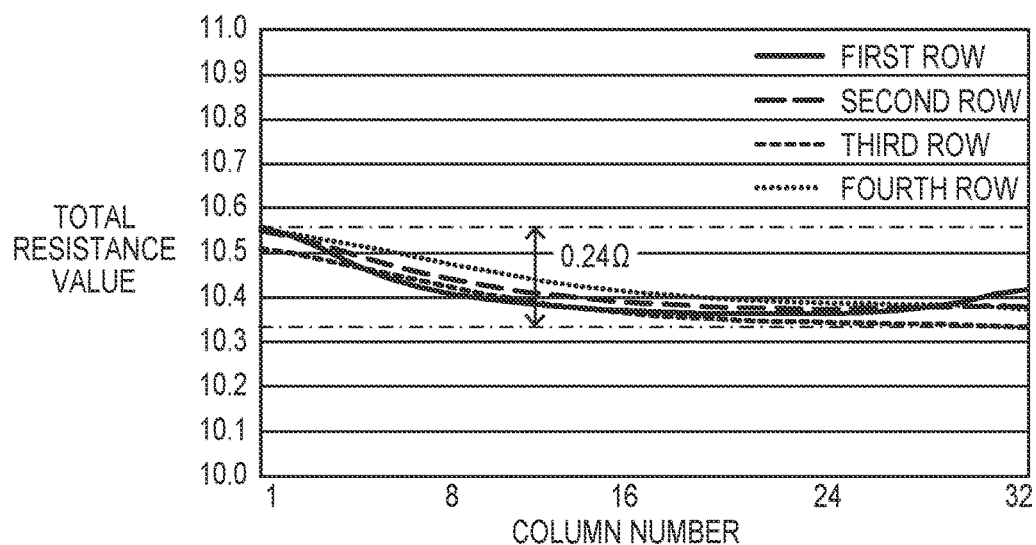
F I G. 12
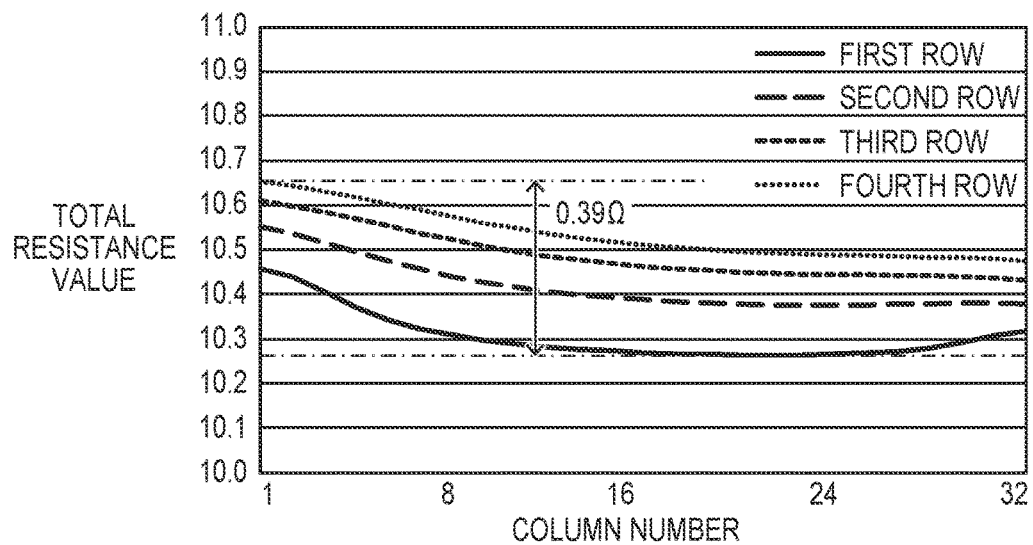

| REGION | RON[Ω] | | |
|---|---|---|---|
| | 1 | 2 | 3 |
| A | EXTRA HIGH | HIGH | MEDIUM |
| B | HIGH | MEDIUM | LOW |
| C | MEDIUM | LOW | EXTRA LOW |

SEMICONDUCTOR DEVICE, LIQUID DISCHARGE HEAD, LIQUID DISCHARGE HEAD CARTRIDGE, AND PRINTING APPARATUS

BACKGROUND OF THE INVENTION

Field of the Invention

The present invention relates to a semiconductor device, a liquid discharge head, a liquid discharge head cartridge, and a printing apparatus.

Description of the Related Art

There is known a liquid discharge head that gives an energy generated by a discharge element to a liquid, thereby discharging the liquid from a discharge portion. To implement high-speed printing, a plurality of discharge elements is arranged in the liquid discharge head. If the voltage applied to the discharge elements varies, the amount of the discharge liquid varies, and the image quality of a formed image may lower. Japanese Patent Laid-Open No. 2014-94514 discloses a wiring pattern configured to reduce a variation in the voltage applied to the discharge elements, which is caused by a wiring resistance that changes in accordance with the wiring length from a terminal unit to each discharge element, when supplying power to the plurality of discharge elements arranged in the liquid discharge head. More specifically, Japanese Patent Laid-Open No. 2014-94514 describes arranging the connecting portions between a power supply wiring line and a ground wiring line at two ends and gradually changing the wiring widths of the power supply wiring line and the ground wiring line.

SUMMARY OF THE INVENTION

In some cases, it may be difficult to reduce the variation in the voltage applied to the discharge elements by the wiring pattern because there is a restriction on the layout to, for example, arrange the terminal unit for the power supply wiring line and the ground wiring line on one side. An aspect of the present invention provides a technique advantageous in reducing a restriction on the layout of wiring lines and a terminal unit while reducing a variation in a voltage applied to discharge elements.

According to some embodiments, a semiconductor device comprises a plurality of discharge units each including a discharge element configured to discharge a liquid, and a driving unit configured to drive the discharge element; and a terminal unit configured to supply a power supply to each of the plurality of discharge units via a wiring line, wherein the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a length of a current path from the terminal unit to the first discharge unit is longer than a length of a current path from the terminal unit to the second discharge unit, and a resistance of the first driving unit is lower than a resistance of the second driving unit.

According to some other embodiments, a semiconductor device comprises a plurality of discharge units arranged on a substrate including a first side and a second side parallel to a first direction and a third side and a fourth side parallel to a second direction crossing the first direction, and each including a discharge element configured to discharge a liquid, and a driving unit configured to drive the discharge element; and a terminal unit arranged, in the first direction, between the third side and a region where the plurality of discharge units is arranged, and including a power supply terminal and a ground terminal each configured to supply power to each of the plurality of discharge units via a wiring line, wherein the first direction and the second direction are not orthogonal to each other, an interior angle of an apex formed by one of the first side or an extension line of the first side, and one of the third side or an extension line of the third side is an obtuse angle, the wiring line includes a power supply wiring line configured to connect the power supply terminal to one terminal of each of the plurality of discharge units, and a ground wiring line configured to connect the ground terminal to the other terminal of each of the plurality of discharge units, each of the power supply wiring line and the ground wiring line has a lattice-shaped wiring pattern and is arranged to be stacked on the plurality of discharge units, the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a distance from the first discharge unit to the third side is longer than a distance from the second discharge unit to the third side, and a resistance of the first driving unit is lower than a resistance of the second driving unit.

According to some other embodiments, a liquid discharge head comprises a discharge portion configured to discharge a liquid and a semiconductor device arranged to control the discharge of the liquid from the discharge portion, the semiconductor device comprising a plurality of discharge units each including a discharge element configured to discharge a liquid, and a driving unit configured to drive the discharge element; and a terminal unit configured to supply power to each of the plurality of discharge units via a wiring line, wherein the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a length of a current path from the terminal unit to the first discharge unit is longer than a length of a current path from the terminal unit to the second discharge unit, and a resistance of the first driving unit is lower than a resistance of the second driving unit.

According to some other embodiments, a liquid discharge head cartridge comprises a liquid discharge head and a container configured to hold a liquid, the liquid discharge head comprising a discharge portion configured to discharge a liquid and a semiconductor device arranged to control the discharge of the liquid from the discharge portion, the semiconductor device comprising a plurality of discharge units each including a discharge element configured to discharge a liquid, and a driving unit configured to drive the discharge element; and a terminal unit configured to supply power to each of the plurality of discharge units via a wiring line, wherein the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a length of a current path from the terminal unit to the first discharge unit is longer than a length of a current path from the terminal unit to the second discharge unit, and a resistance of the first driving unit is lower than a resistance of the second driving unit.

According to some other embodiments, a liquid discharged head cartridge is mounted in a printing apparatus, the liquid discharge head cartridge comprising a liquid discharge head and a container configured to hold a liquid, the liquid discharge head comprising a discharge portion configured to discharge a liquid and a semiconductor device arranged to control the discharge of the liquid from the discharge portion, the semiconductor device comprising a plurality of discharge units each including a discharge element configured to discharge a liquid and a driving unit configured to drive the discharge element; and a terminal unit configured to supply power to each of the plurality of discharge units via a wiring line, wherein the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a length of a current path from the terminal unit to the first discharge unit is longer than a length of a current path from the terminal unit to the second discharge unit, and a resistance of the first driving unit is lower than a resistance of the second driving unit.

Further features of the present invention will become apparent from the following description of exemplary embodiments (with reference to the attached drawings).

BRIEF DESCRIPTION OF THE DRAWINGS

FIG. 3 is a table showing an example of resistance values included in paths via the discharge units of the semiconductor device shown in FIG. 1;

FIG. 10 is a table showing an example of the magnitude relationship of the resistance values of the driving units of the semiconductor device shown in FIG. 8;

FIG. 11 is a graph showing an example of resistance values included in paths via the discharge units of the semiconductor device shown in FIG. 8;

FIG. 12 is a graph showing an example of resistance values included in paths via the discharge units according to a comparative example of the semiconductor device shown in FIG. 8;

DESCRIPTION OF THE EMBODIMENTS

Figure 1:
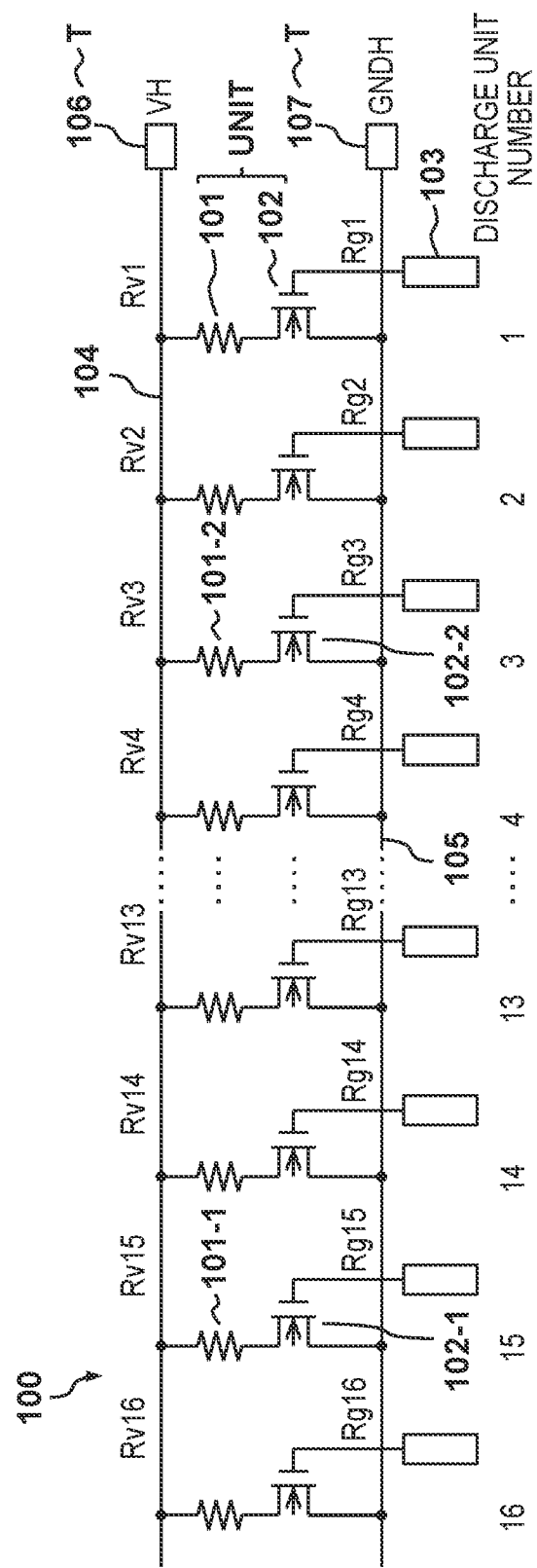
FIG. 1 is a circuit diagram showing an example of the circuit arrangement of a semiconductor device according to an embodiment of the present invention.

Detailed embodiments of a semiconductor device according to the present invention will now be described with reference to the accompanying drawings. Note that in the following description and drawings, common reference numerals denote common components throughout a plurality of drawings. Hence, the common components will be described by cross-referring to the plurality of drawings, and a description of components denoted by common reference numerals will appropriately be omitted.

The structure of a semiconductor device according to an embodiment of the present invention will be described with reference to FIGS. 1 to 4. FIG. 1 is a circuit diagram showing the circuit arrangement of a semiconductor device 100 according to a first embodiment of the present invention. The semiconductor device 100 is configured to control discharge of a liquid. The semiconductor device 100 is configured to control discharge of a liquid from a discharge portion in, for example, a printing apparatus that prints an image on a printing medium such as paper using a liquid such as ink.

The semiconductor device 100 includes a terminal unit T including a power supply terminal 106 (VH terminal) and a ground terminal 107 (GNDH terminal), a plurality of discharge units UNIT, a power supply wiring line 104 (VH wiring line), and a ground wiring line 105 (GNDH wiring line). The power supply terminal 106 and the ground terminal 107 supply power to the discharge units UNIT via the power supply wiring line 104 and the ground wiring line 105. The semiconductor device 100 may include a plurality of control circuits 103 (typically, logic circuits) that control the plurality of discharge units UNIT. Each control circuit 103 may control a corresponding discharge unit UNIT in accordance with an external signal (not shown). Each discharge unit UNIT may include a discharge element 101 configured to apply energy to a liquid such as ink to discharge the liquid from a discharge portion, and a driving unit 102 configured to drive the discharge element 101. One terminal and the other terminal of each discharge unit UNIT are connected to the power supply wiring line 104 and the ground wiring line 105, respectively. The discharge element 101 and the driving unit 102 are connected in series between the one terminal and the other terminal. Here, the discharge element 101 is, for example, a heating element such as a heater or a piezoelectric element and can generate energy to discharge the liquid. In the arrangement shown in FIG. 1, the discharge element 101 is a heating element and is represented as a resistance in the circuit diagram. The driving unit 102 may be a circuit element that controls application of electric energy to the discharge element 101. The driving unit 102 may be, for example, a transistor such as a power transistor capable of controlling a current. FIG. 1 illustrates an n-type transistor (power transistor) as the driving unit 102. The output of the control circuit 103 is connected to the gate electrode of the transistor of the driving unit 102, thereby controlling the driving unit 102.

Figure 2:
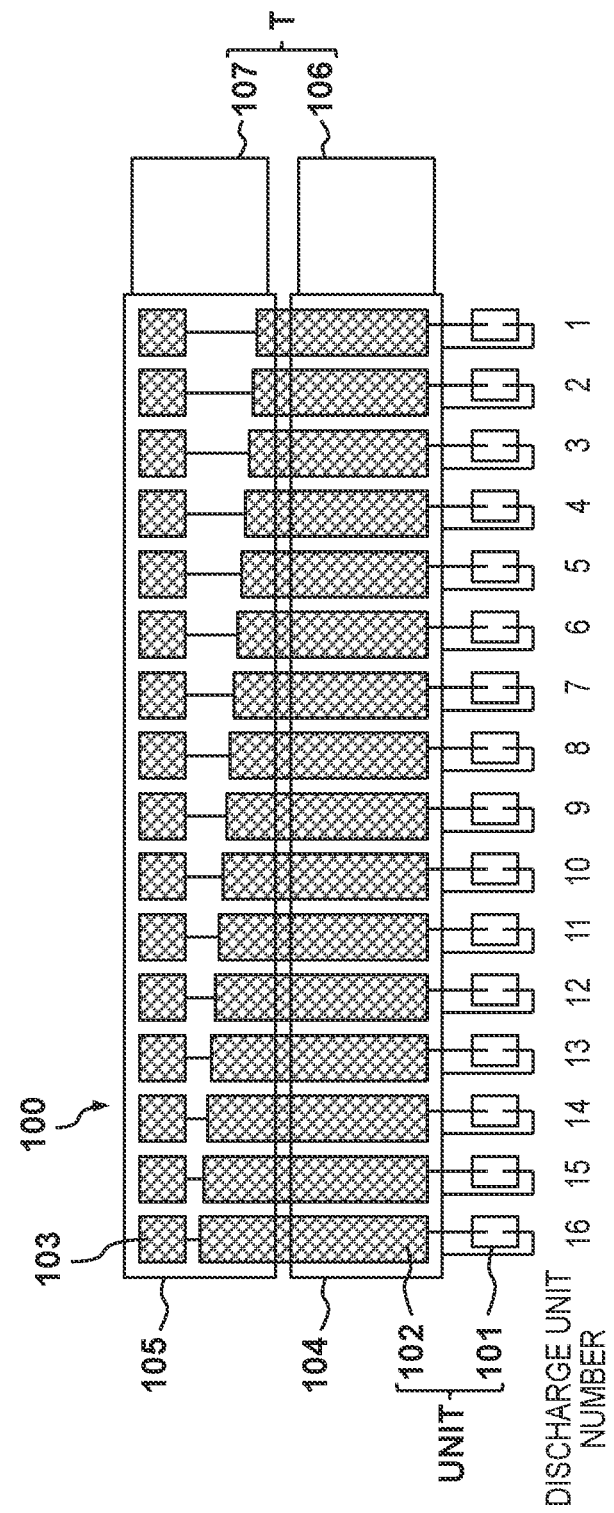
FIG. 2 is a circuit diagram showing an example of the arrangement of the components of the semiconductor device shown in FIG. 1.

FIG. 2 shows an example of the arrangement of the components of the semiconductor device 100, including the discharge elements 101, the driving units 102, the control circuits 103, the power supply wiring line 104, the ground wiring line 105, the power supply terminal 106, and the ground terminal 107. The semiconductor device 100 is typically formed on a substrate (semiconductor substrate) using a silicon substrate or the like using a multilayer wiring technique. The power supply wiring line 104 may be formed using, for example, a metal wiring line (the metal wiring line may be made of a metal such as aluminum or an alloy thereof) of the second layer so as to pass on the driving units 102. The power supply wiring line 104 extends from the power supply terminal 106 and supplies a power supply voltage to each discharge unit UNIT. The ground wiring line 105 may be formed using, for example, a metal wiring line (the metal wiring line may be made of a metal such as aluminum or an alloy thereof) of the second layer that is the same as for the power supply wiring line 104 so as to pass on the control circuits 103. The ground wiring line 105 extends from the ground terminal 107 and supplies a ground voltage to each discharge unit UNIT. Each of the power supply wiring line 104 and the ground wiring line 105 typically has a fixed thickness. The terminal unit T including the power supply terminal 106 and the ground terminal 107 is arranged at one end of the array of the discharge units UNIT. In the arrangement shown in FIG. 2, the plurality of discharge units UNIT is arranged on the left side of the terminal unit T. Additionally, in the arrangement shown in FIG. 2, the semiconductor device 100 includes 16 discharge units UNIT. However, the number of discharge units may be 15 or less or 17 or more.

In the semiconductor device 100, the layout is done such that the resistance when the driving unit 102 of the discharge unit UNIT far from the terminal unit T drives the discharge element 101 becomes lower than the resistance when the driving unit 102 of the discharge unit UNIT close to the terminal unit T drives the discharge element 101. For example, the layout is done such that the resistance when the driving unit 102 included in each discharge unit UNIT drives the discharge element 101 decreases as the distance from the terminal unit T to the discharge unit UNIT becomes long. The resistance when the driving unit 102 drives the discharge element 101 may decrease continuously or stepwise. The driving unit 102 included in each of the plurality of discharge units UNIT includes a transistor. The resistance of the driving unit 102 is the resistance when the driving unit 102 drives a corresponding discharge element 101, that is, an ON resistance RON of the transistor provided in each driving unit 102. For example, the transistor used in the driving unit 102 included in the discharge unit UNIT is laid out such that a channel width W (gate width) becomes large continuously or stepwise as the distance to arrange the transistor apart from the terminal unit T becomes long. If such a layout is used, the ON resistance RON of a transistor as the resistance of the driving unit 102 close to the terminal unit T is equal to or higher than the ON resistance RON of the transistor of the driving unit 102 farther from the terminal unit T than the driving unit 102. In this specification, the ON resistance RON indicates a resistance value calculated based on a drain current amount and the potential difference between the drain and the source of the transistor of the driving unit 102.

The resistance of the driving unit 102 when driving the discharge element 101 of the driving unit 102 will be described together with the parasitic resistance between the power supply terminal 106 and each discharge unit UNIT and the parasitic resistance between each discharge unit UNIT and the ground terminal 107. The parasitic resistance between the power supply terminal 106 and each discharge unit UNIT includes a wiring resistance RVH of the power supply wiring line 104. As shown in FIG. 1, for example, a resistance Rv(1) exists as the wiring resistance RVH between the power supply terminal 106 of the terminal unit T and discharge unit UNIT 1. In addition, the resistance Rv(1) and a resistance Rv(2) exist as the wiring resistance RVH between the power supply terminal 106 and discharge unit UNIT 2. A resistance ERv(i) exists as the wiring resistance RVH between the power supply terminal 106 and discharge unit UNIT i. Here, the resistance Rv(1) is the wiring resistance of the power supply wiring line 104 between the power supply terminal 106 and discharge unit UNIT 1. The resistance Rv(i) (i≥2) is the wiring resistance of the power supply wiring line 104 between a discharge unit UNIT(i) and a discharge unit UNIT(i−1). Similarly, the parasitic resistance between each discharge unit UNIT and the ground terminal 107 includes a wiring resistance RGNDH of the ground wiring line 105. For example, a resistance Rg(1) exists as the wiring resistance RGNDH between the ground terminal 107 of the terminal unit T and discharge unit UNIT 1. In addition, the resistance Rg(1) and a resistance Rg(2) exist as the wiring resistance RGNDH between the ground terminal 107 and discharge unit UNIT 2. A resistance ΣRg(i) exists as the wiring resistance RGNDH between the ground terminal 107 and discharge unit UNIT i. Here, the resistance Rg(1) is the wiring resistance of the ground wiring line 105 between the ground terminal 107 and discharge unit UNIT 1. The resistance Rg(i) (i≥2) is the wiring resistance of the ground wiring line 105 between the discharge unit UNIT(i) and the discharge unit UNIT(i−1).

For this reason, in the discharge unit UNIT far from the terminal unit T, the resistance value of the wiring resistance included in the current path from the power supply terminal 106 to the ground terminal 107 via the discharge unit UNIT is larger than in the discharge unit UNIT close to the terminal unit T. Hence, when the discharge units UNIT operate, the voltage applied to the discharge unit UNIT far from the terminal unit T becomes lower than the voltage applied to the discharge unit UNIT close to the terminal unit T, and the applied voltage varies between the discharge units UNIT. If the applied voltage varies between the discharge units UNIT, the voltage applied to the discharge elements 101 included in the discharge units UNIT varies. For this reason, the amount of the liquid discharged by the discharge elements 101 varies, and the image quality of a formed image may degrade.

To prevent this, in this embodiment, the driving units 102 are formed such that of the driving units 102, the ON resistance RON of the transistor of the driving unit 102 whose distance from the terminal unit T is long becomes lower than the ON resistance RON of the transistor of the driving unit 102 whose distance from the terminal unit T is short. For example, the ON resistance RON of the transistor of the driving unit 102 may become lower continuously or stepwise in accordance with the distance from the terminal unit T as the distance from the terminal unit T becomes long.

Accordingly, the variation in the total resistance value of the resistance values of the parasitic resistances including the wiring resistances RVH and RGNDH and the resistance value of the ON resistance RON is reduced as compared to a case in which the same transistor is used in the discharge units UNIT. This reduces the variation in the voltage applied to the discharge elements 101 included in the discharge units UNIT. As a result, the variation in the amount of the liquid discharged by the discharge elements 101 is reduced, and the image quality of a formed image can improve.

More specifically, consider a case in which the discharge elements 101 include a first discharge element 101-1 and a second discharge element 101-2 to which a voltage higher than that for the first discharge element 101-1 is applied, as shown in FIG. 1. In this case, the resistance of a driving unit 102-1 of the first discharge element 101-1 is made lower than the resistance of a driving unit 102-2 of the second discharge element 101-2. For example, the resistance of the current path from the terminal unit (power supply terminal 106) to the discharge unit including the first discharge element 101-1 is sometimes higher than the resistance of the current path from the terminal unit to the second discharge unit including the second discharge element 101-2. In the arrangement shown in FIG. 1, the discharge element 101 included in discharge unit UNIT 15 is the first discharge element 101-1, and the discharge element 101 included in discharge unit UNIT 3 is the second discharge element 101-2. However, the combination is not limited to this. Any combination that makes the voltage applied to the second discharge element 101-2 higher than that for the first discharge element 101-1 is usable.

In this case, the resistance of the first driving unit 102-1 is made lower than the resistance of the second driving unit 102-2. For example, different ON resistances are set for the transistor arranged in the current path from the power supply terminal 106 to the first discharge element 101-1 and the transistor arranged in the current path from the power supply terminal 106 to the second discharge element 101-2. More specifically, the ON resistance of a transistor 121-1 connected to the first discharge element 101-1 is made lower than the ON resistance of a transistor 121-2 connected to the second discharge element 101-2.

With this arrangement, the difference between the voltage applied to the first discharge element 101-1 and the voltage applied to the second discharge element 101-2 can be eliminated or reduced. If a plurality of transistors is arranged in the current path from the terminal unit T to a discharge element, adjustment can be done by the sum of the ON resistances of the transistors.

When the variation between the resistance values inserted in series for each current path corresponding to each of the discharge elements 101 of the discharge units UNIT is reduced, the variation in the current value flowing to the discharge elements 101 is reduced. As a result, it is possible to reduce the variation in the heat generation amount between the discharge elements 101 and suppress shortening of the life of a specific discharge element 101. In addition, the transistor of the driving unit 102 close to the terminal unit T may have lower drivability (higher resistance) than the transistor of the driving unit 102 far from the terminal unit T. It is therefore possible to use a relatively small transistor having a small channel width W and consequently improve the use efficiency of the area of the semiconductor device 100.

In the semiconductor device 100 shown in FIG. 2, the terminal unit T including the power supply terminal 106 and the ground terminal 107 is arranged to be adjacent to one side of the region where the discharge units UNIT are arranged. In this case, if a fixed resistance value is set for the discharge units UNIT by adjusting the widths of the power supply wiring line 104 and the ground wiring line 105, the widths of the power supply wiring line 104 and the ground wiring line 105 become very large at the end on the side far from the terminal unit T, as compared to the side of the terminal unit T. Meanwhile, when the arrangement according to this embodiment is used, even if the terminal unit T is provided on one side, the variation in the voltage applied to the discharge units UNIT caused by the wiring resistance can be reduced by the ON resistances RON of the transistors, and therefore, the wiring width need not be changed. It is therefore possible to reduce the restriction on the layout of the wiring lines and the terminal unit T while reducing the variation in the voltage applied to the discharge elements.

For example, as shown in FIG. 3, the transistor may be arranged for each discharge unit UNIT such that the total resistance value of the wiring resistance RVH of the power supply wiring line 104, the wiring resistance RGNDH of the ground wiring line 105, and the ON resistance RON of the transistor of the driving unit 102 has a fixed value. In the arrangement shown in FIG. 3, the ON resistance RON of the transistor changes continuously from 14.25 Ω of the transistor of discharge unit UNIT 1 close to the terminal unit T to 12 Ω of the transistor of discharge unit UNIT 16 far from the terminal unit T. In the transistor, the ON resistance RON and the channel width W are inversely proportional to each other if the rest of the arrangement is the same. For this reason, the channel width W of the transistor of discharge unit UNIT 16 can be 14.25/12 times larger than the channel width of the transistor of discharge unit UNIT 1 if the rest of the arrangement is the same.

In the arrangement shown in FIG. 3, the ON resistance RON of the transistor of the driving unit 102 is continuously changed such that the total resistance value of the wiring resistances RVH and RGNDH and the ON resistance RON of the transistor of the driving unit 102 has a fixed value. However, the present invention is not limited to this. For example, a plurality of discharge units UNIT may be put into a group, and the ON resistance RON of the transistor of the driving unit 102 may be changed stepwise on a group basis. It is only necessary to reduce the variation in the total resistance value of the parasitic resistance including the wiring resistances RVH and RGNDH and the ON resistance RON between the discharge units UNIT as compared to a case in which the same transistor is used in the driving units 102 of the discharge units UNIT.

In addition, the means used to change the resistance (ON resistance RON) of the transistor of the driving unit 102 is not limited to the change of the channel width W of the transistor. For example, the resistance may be changed by changing a channel length L of the transistor of the driving unit 102. Let W1 be the channel width W of the transistor of the driving unit 102 of the discharge unit UNIT of interest, and L1 be the channel length L. In addition, let W2 be the channel width W of the transistor of the driving unit 102 farther from the terminal unit T than the discharge unit UNIT of interest, and L2 be the channel length L. In this case, the variation in the voltage applied to the discharge elements 101 of the discharge units UNIT can be reduced by satisfying W1/L1<W2/L2.

Additionally, for example, if transistors having the same channel width W and channel length L are used as the transistors of the driving units 102, a gate voltage Vgs applied to the transistors of the driving units 102 may be changed when driving the discharge elements 101. In this case, the gate voltage Vgs applied to the transistor of the discharge unit UNIT is made higher than the gate voltage Vgs applied to the transistor of the discharge unit UNIT whose distance from the terminal unit T is shorter than the distance from the terminal unit T to the discharge unit UNIT. For example, the gate voltage Vgs applied to the transistor included in each discharge unit UNIT is increased continuously or stepwise as the distance from the terminal unit T to each discharge unit UNIT becomes long. The variation in the voltage applied to the discharge elements 101 of the discharge units UNIT can thus be reduced. In addition, the changes in the channel width W, the channel length L, and the gate voltage Vgs between the transistors of the driving units 102 of the discharge units UNIT may be used in combination.

Figure 4:
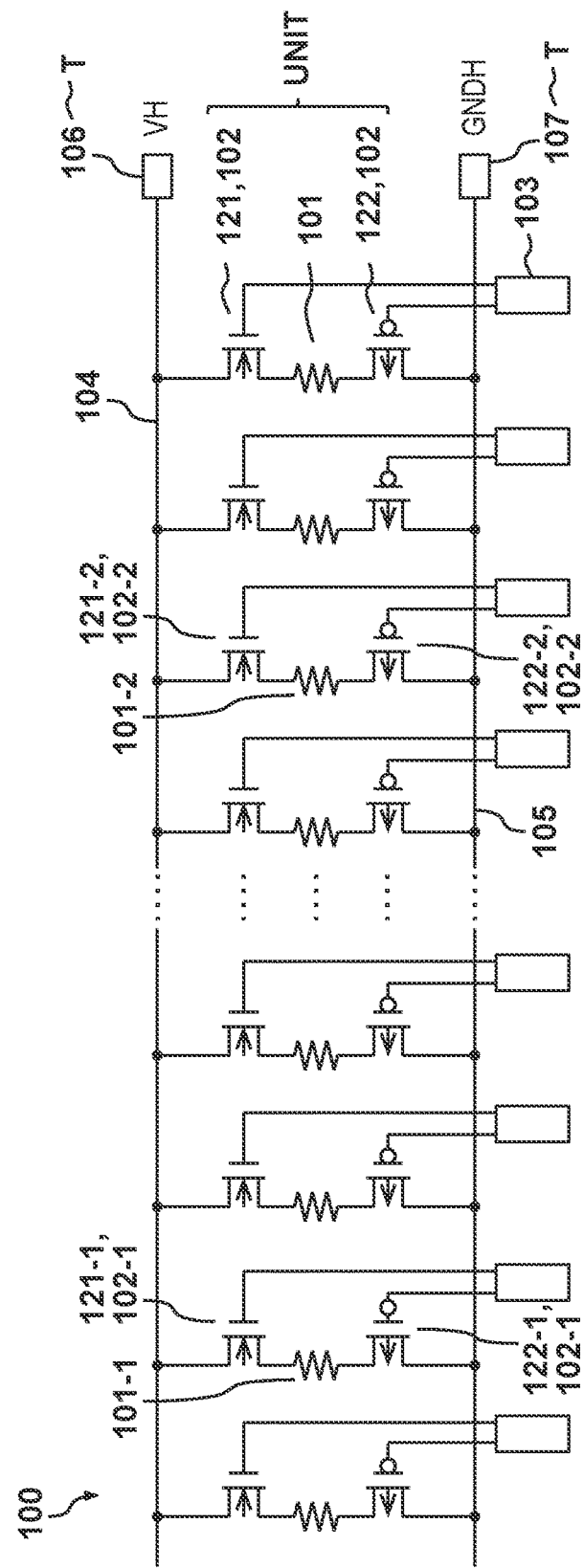
FIG. 4 is a circuit diagram showing a modification of the circuit arrangement shown in FIG. 1.

FIG. 4 is a circuit diagram showing a modification of the circuit arrangement of the semiconductor device 100 shown in FIG. 1. In the circuit arrangement shown in FIG. 1, the discharge element 101 is driven by the driving unit 102 formed by one transistor. However, the present invention is not limited to this, and the driving unit 102 may be formed by a plurality of transistors. In the arrangement shown in FIG. 4, the driving unit 102 includes a transistor 121 and a transistor 122. In each discharge unit UNIT, the n-type transistor 121, the discharge element 101, and the p-type transistor 122 are arranged in this order from the side of the power supply wiring line 104 to the side of the ground wiring line 105. The output of the control circuit 103 is connected to the gate electrodes of the transistors 121 and 122 of the driving unit 102. The driving unit 102 of this arrangement will be referred to as a voltage compensation driving unit. The rest of the arrangement may be the same as in FIG. 1.

The voltage compensation driving unit can be designed to operate the transistors 121 and 122 in the saturated region. Meanwhile, as described above, depending on the position to arrange the discharge unit UNIT, the source and drain voltages of the transistors 121 and 122 arranged in the discharge unit UNIT change because of the difference in the parasitic resistance including the wiring resistances of the power supply wiring line 104 and the ground wiring line 105. For this reason, if the transistors 121 and 122 have the same size in all the discharge units UNIT, the voltage applied to the discharge element 101 varies due to the channel length modulation effect. To correct this, the resistance of the driving unit 102 is changed.

More specifically, consider a case in which the discharge elements 101 include the first discharge element 101-1 and the second discharge element 101-2 to which a voltage higher than that for the first discharge element 101-1 is applied, as shown in FIG. 4. In this case, the resistance of the first driving unit 102-1 of the first discharge element 101-1 is made lower than the resistance of the second driving unit 102-2 of the second discharge element 101-2. For example, the resistance of the current path from the terminal unit (power supply terminal 106) to the discharge unit including the first discharge element 101-1 is sometimes higher than the resistance of the current path from the terminal unit to the second discharge unit including the second discharge element 101-2.

In this case, the resistance of the first driving unit 102-1 is made lower than the resistance of the second driving unit 102-2. For example, different ON resistances are set for the transistor arranged in the current path from the power supply terminal 106 to the first discharge element 101-1 and the transistor arranged in the current path from the power supply terminal 106 to the second discharge element 101-2. More specifically, the ON resistance of the transistor 121-1 connected to the first discharge element 101-1 is made lower than the ON resistance of the transistor 121-2 connected to the second discharge element 101-2.

With this arrangement, the difference between the voltage applied to the first discharge element 101-1 and the voltage applied to the second discharge element 101-2 can be eliminated or reduced. If a plurality of transistors is arranged in the current path from the terminal unit T to a discharge element, adjustment can be done by the sum of the ON resistances of the transistors.

In addition, the resistance of the current path from the terminal unit (ground terminal 107) to the discharge unit including the first discharge element 101-1 is sometimes higher than the resistance of the current path from the terminal unit to the second discharge unit including the second discharge element 101-2.

In this case, the resistance of the first driving unit 102-1 is made lower than the resistance of the second driving unit 102-2. For example, different ON resistances are set for the transistor arranged in the current path from the ground terminal 107 to the first discharge element 101-1 and the transistor arranged in the current path from the ground terminal 107 to the second discharge element 101-2. More specifically, the ON resistance of a transistor 122-1 connected to the first discharge element 101-1 is made lower than the ON resistance of a transistor 122-2 connected to the second discharge element 101-2.

With this arrangement, the difference between the voltage applied to the first discharge element 101-1 and the voltage applied to the second discharge element 101-2 can be eliminated or reduced.

To change the ON resistance between the transistors 121 and 122, for example, the size is changed between the transistors 121 and 122. In the voltage compensation driving unit as well, the ON resistance is the function of the drain-source voltage and the drain current amount of the transistor of the driving unit 102.

The source-drain voltage to supply a predetermined drain current is lower in a transistor of high drivability than in a transistor of low drivability. For this reason, for example, the channel width W of the transistor included in the discharge unit UNIT may be increased as the distance from the terminal unit T becomes long. In addition, for example, the channel length L of the transistor included in the discharge unit UNIT may be decreased as the distance from the terminal unit T becomes long. Furthermore, for example, if transistors having the same channel width W and channel length L are used as the transistors 121 and 122 of the driving units 102, the gate voltage Vgs applied to the transistors 121 and 122 of the driving units 102 may be changed when driving the discharge elements 101. In this case, the gate voltage of the transistor 121 and 122 of the driving unit 102 of the discharge unit UNIT of interest is set to be equal to or lower than the gate voltage of the transistors 121 and 122 of the driving unit 102 farther from the terminal unit T than the discharge unit UNIT of interest. As in the above-described embodiment, in accordance with the distance from the terminal unit T, the ON resistance RON of the transistors 121 and 122 of the driving unit 102 is decreased continuously or stepwise as the distance from the terminal unit T becomes long. The variation in the voltage applied to the discharge elements 101 of the discharge units UNIT can thus be reduced.

FIG. 2 shows an example in which the power supply terminal 106 and the ground terminal 107 are arranged on one side of the region where the discharge units UNIT are arranged. However, the semiconductor device 100 of this embodiment is not limited to this. For example, power supply terminals 106 may be arranged on both sides of the region where the discharge units UNIT are arranged, and ground terminals 107 may also be arranged on both sides of the region where the discharge units UNIT are arranged. In this case, the wiring resistances of the power supply wiring line 104 and the ground wiring line 105 increase toward the center of the region where the discharge units UNIT are arranged. Hence, the variation in the voltage applied to the discharge elements 101 of the discharge units UNIT can be reduced by lowering the ON resistance RON of the transistor of the driving unit 102 toward the center. As described above, when the semiconductor device 100 according to this embodiment is used, it is possible to reduce the variation in the voltage applied to the discharge elements 101 while reducing the restriction on the layout of the wiring lines and the terminal unit.

Figure 5:
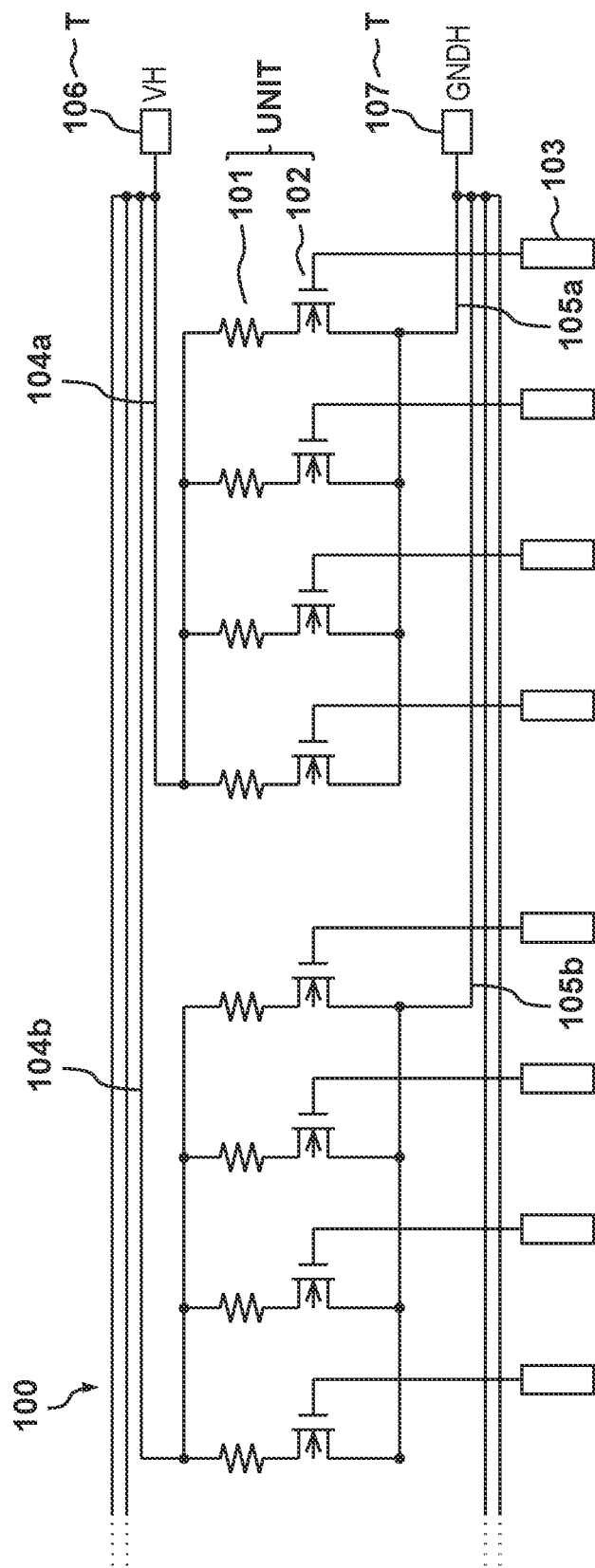
FIG. 5 is a circuit diagram showing an example of the circuit arrangement of a semiconductor device according to another embodiment of the present invention.

The structure of a semiconductor device according to another embodiment of the present invention will be described with reference to FIGS. 5 to 7. FIG. 5 is a circuit diagram showing the circuit arrangement of a semiconductor device 100 according to a second embodiment of the present invention. In this embodiment, four discharge units UNIT adjacent to each other are defined as one segment (discharge unit group). The discharge units UNIT are connected to a power supply terminal 106 and a ground terminal 107 on a segment basis via power supply wiring lines 104 (power supply wiring lines 104a, 104b, 104c, and 104d in this embodiment) connected in parallel to the power supply terminal 106 and ground wiring lines 105 (ground wiring lines 105a, 105b, 105c, and 105d in this embodiment) connected in parallel to the ground terminal 107. The rest of the arrangement may be the same as in the above-described first embodiment.

Figures 6, 7:
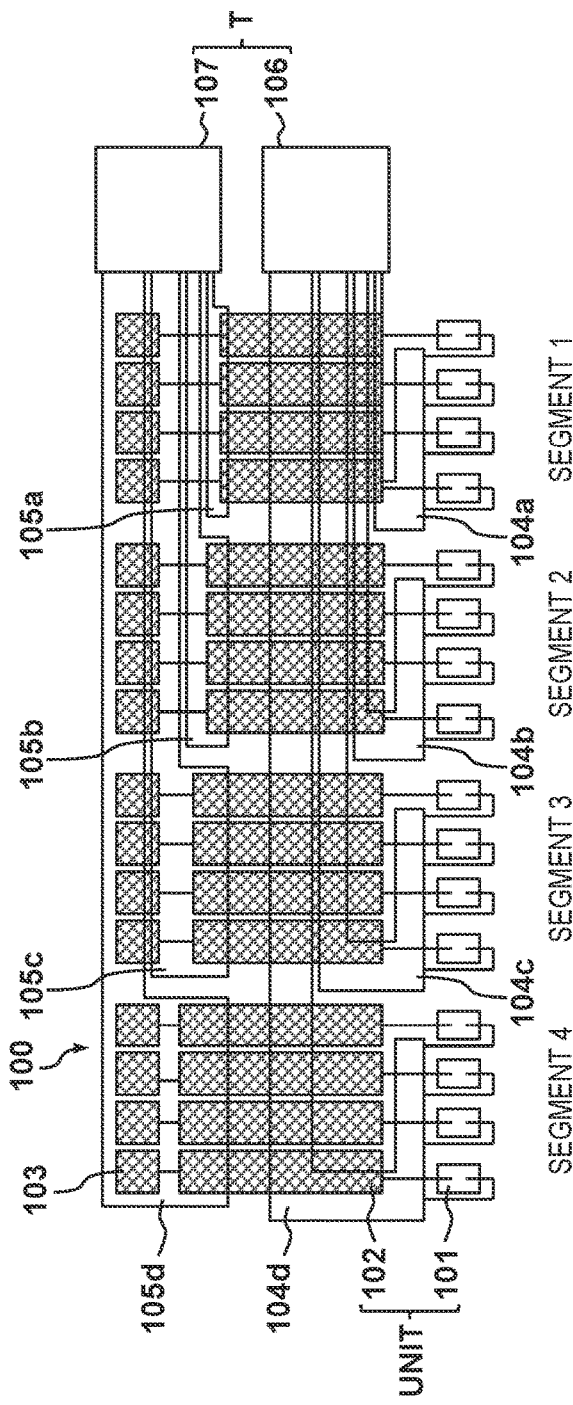
FIG. 6 is a circuit diagram showing an example of the arrangement of the components of the semiconductor device shown in FIG. 5.
FIG. 7 is a table showing an example of resistance values including in paths via the discharge units of the semiconductor device shown in FIG. 5.

FIG. 6 shows an example of the arrangement of the components of the semiconductor device 100, including discharge elements 101, driving units 102, control circuits 103, the power supply wiring lines 104a to 104d, the ground wiring lines 105a to 105d, the power supply terminal 106, and the ground terminal 107. In this embodiment, four discharge units UNIT are defined as one segment, and four segments are arranged in the semiconductor device 100. A power supply voltage is applied from the power supply terminal 106 to segment 1 via the power supply wiring line 104a, to segment 2 via the power supply wiring line 104b, to segment 3 via the power supply wiring line 104c, and to segment 4 via the power supply wiring line 104d. A ground voltage is applied from the ground terminal 107 to segment 1 via the ground wiring line 105a, to segment 2 via the ground wiring line 105b, to segment 3 via the ground wiring line 105c, and to segment 4 via the ground wiring line 105d. In this embodiment as well, a terminal unit T including the power supply terminal 106 and the ground terminal 107 is arranged to be adjacent to one side of the region where the discharge units UNIT are arranged, as in the first embodiment.

The semiconductor device 100 is typically formed on a substrate (semiconductor substrate) using a silicon substrate or the like using a multilayer wiring technique. The power supply wiring lines 104a to 104d may be formed using, for example, a metal wiring line (the metal wiring line may be made of a metal such as aluminum or an alloy thereof) of the second layer so as to pass on the driving units 102. The ground wiring lines 105a to 105d may be formed using, for example, a metal wiring line (the metal wiring line may be made of a metal such as aluminum or an alloy thereof) of the second layer that is the same as for the power supply wiring lines 104a to 104d so as to pass on the control circuits 103. Each of the power supply wiring lines 104 and the ground wiring lines 105 has, for example, a fixed thickness. In the arrangement shown in FIG. 6, four discharge units UNIT are arranged in one segment in the semiconductor device 100. However, the number of discharge units UNIT arranged in one segment may be 1 to 3, or 5 or more. In the arrangement shown in FIG. 6, four segments are arranged in the semiconductor device 100. However, the number of segments may be 2 or 3, or 5 or more. Additionally, for example, the number of discharge units UNIT arranged may change between the segments.

In this embodiment, the layout is done such that the average wiring resistance per unit length of the power supply wiring line 104 connected to the segment far from the terminal unit T becomes lower than the average wiring resistance per unit length of the power supply wiring line 104 connected to the segment close to the terminal unit T. Similarly, the layout is done such that the average wiring resistance per unit length of the ground wiring line 105 connected to the segment far from the terminal unit T becomes lower than the average wiring resistance per unit length of the ground wiring line 105 connected to the segment close to the terminal unit T. For example, the power supply wiring lines 104a to 104d and the ground wiring lines 105a to 105d may be arranged such that the average wiring resistance per unit length decreases continuously or stepwise as the distance from the terminal unit T to the connected segment becomes long. To implement this, for example, the wiring lines may be formed such that the line width of the wiring pattern of the wiring line connected to the segment close to the terminal unit T becomes equal to or smaller than the line width of the wiring pattern of the wiring line connected to the segment far from the terminal unit T. In addition, for example, the average line width of the wiring pattern of the wiring line connected to the segment close to the terminal unit T may be equal to or smaller than the average line width of the wiring pattern of the wiring line connected to the segment far from the terminal unit T.

As in the first embodiment, the layout is done such that the resistance when the driving unit 102 included in each discharge unit UNIT drives the discharge element 101 decreases continuously or stepwise as the distance from the terminal unit T to the discharge unit UNIT becomes long. In the arrangement shown in FIG. 6, a channel width W of a transistor used as the driving unit 102 is changed on a segment basis, thereby changing an ON resistance RON of the transistor and consequently changing the resistance at the time of driving of the driving unit 102.

To reduce the variation in the magnitude of the wiring resistance between the segments, it is effective to thin the wiring pattern of the wiring line connected to segment 1 close to the terminal unit T to increase the resistance value and thicken the wiring pattern of the wiring line connected to segment 4 far from the terminal unit T to decrease the resistance value. However, in general, the formable minimum line width of a wiring pattern may be determined from the viewpoint of the accuracy of finishing or the like. The maximum line width can also be limited by the size of the whole layout of the semiconductor device 100 or the like. If the minimum and maximum widths of the wiring pattern are limited, the resistance values of wiring resistances RVH and RGNDH are not constant and vary between the segments. For this reason, if transistors having the same size are used in the driving units 102, the voltage applied to the discharge elements 101 may vary between the segments. To prevent this, a transistor having the ON resistance RON lower than that of the driving unit 102 included in the discharge unit UNIT of the segment whose distance from the terminal unit T is shorter than the distance from the terminal unit T to the discharge unit UNIT is used in the driving unit 102 included in the discharge unit UNIT. The variation between the resistance values inserted in series for each current path corresponding to each of the discharge elements 101 of the discharge units UNIT is reduced, and the variation in the voltage applied to the discharge elements 101 is reduced.

Accordingly, even if the variation in the voltage applied to the discharge elements 101 cannot completely be reduced by the wiring pattern because of the restriction on the layout of the wiring lines and the terminal unit, the variation in the voltage applied to the discharge elements 101 can be reduced more effectively.

If the variation in the voltage applied to the discharge elements 101 is to be reduced only by the widths of the wiring lines, the line width needed to reduce the difference in the voltage may become smaller than the minimum width formable from the viewpoint of the accuracy of finishing or the like. In this case, since the wiring line width cannot be made smaller than the minimum value, it is necessary to define the wiring line width of a wiring line for the maximum voltage applied to the discharge elements 101 as the minimum value and determine other wiring line widths.

Meanwhile, in this embodiment, the values of the ON resistances RON of the transistors used in the driving units 102 can also be used to reduce the variation in the voltage applied to the discharge elements 101. It is therefore possible to reduce the variation in the voltage applied to the discharge elements 101 while reducing the restriction on the layout of the wiring lines and the terminal unit.

For example, as shown in FIG. 7, the wiring resistances RVH of the power supply wiring lines 104a to 104d, the wiring resistances RGNDH of the ground wiring lines 105a to 105d, and the ON resistances RON of the transistors of the driving units 102 may be set such that the total resistance values equal each other between the segments. In this embodiment, the ON resistance RON of the transistor of the driving unit 102 is changed between the segments. However, the ON resistance RON of the transistor of the driving unit 102 may be further changed in each segment. The ON resistance RON of the transistor of the driving unit 102 can be adjusted by appropriately selecting the channel width W, a channel length L, or a gate voltage Vgs, as in the first embodiment.

In addition, the transistor of the driving unit 102 of the segment close to the terminal unit T may have lower drivability (higher resistance) than the transistor of the driving unit 102 of the segment far from the terminal unit T. Hence, when adjusting the resistance by changing the channel width W, a transistor whose channel width W is small relative to the transistor of the driving unit 102 of the segment far from the terminal unit T can be used as the transistor of the segment close to the terminal unit T. It is therefore possible to improve the use efficiency of the area of the semiconductor device 100, as in the first embodiment.

Figure 8:
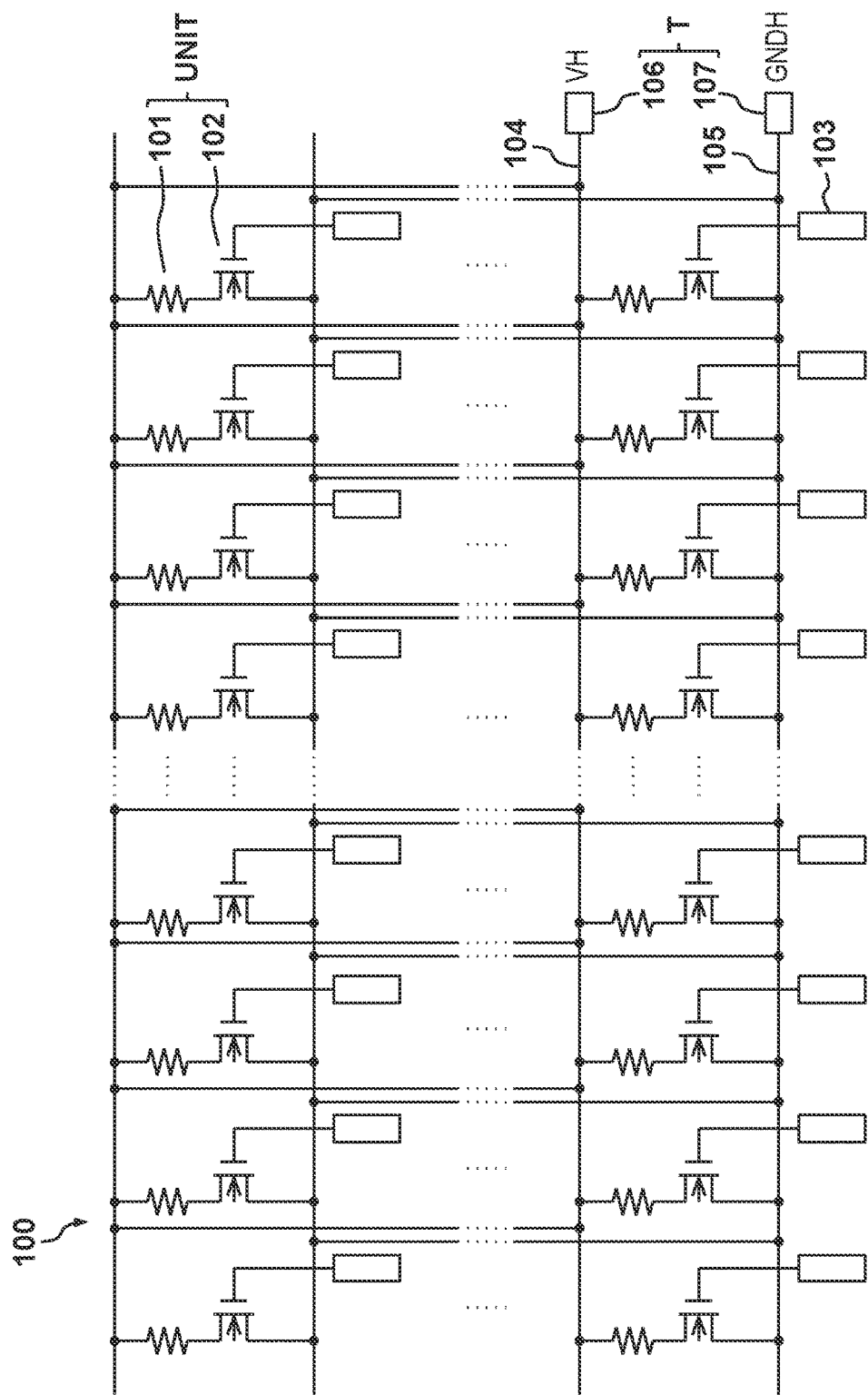
FIG. 8 is a circuit diagram showing an example of the circuit arrangement of a semiconductor device according to still another embodiment of the present invention.

The structure of a semiconductor device according to still another embodiment of the present invention will be described with reference to FIGS. 8 to 12. FIG. 8 is a circuit diagram showing the circuit arrangement of a semiconductor device 100 according to a third embodiment of the present invention. In this embodiment, a plurality of discharge units UNIT is arranged not one-dimensionally but in a matrix, unlike the above-described first and second embodiments. In addition, a power supply wiring line 104 configured to apply a power supply voltage from a power supply terminal 106 to the discharge units UNIT and a ground wiring line 105 configured to apply a ground voltage from a ground terminal 107 to the discharge units UNIT are arranged in a lattice. The rest of the arrangement may be the same as in the above-described first embodiment.

Figure 9:
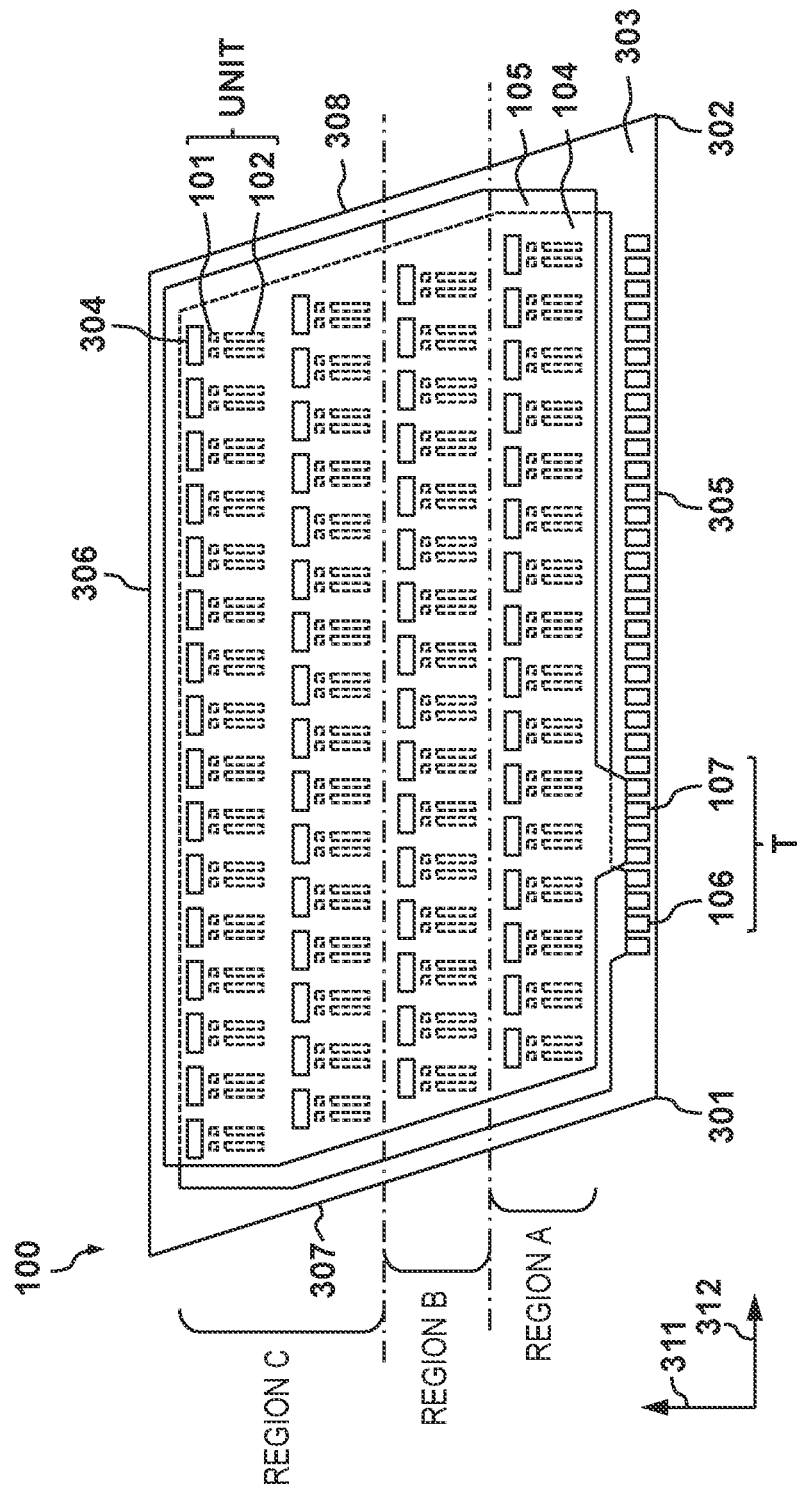
FIG. 9 is a view showing an example of the arrangement of the components of the semiconductor device shown in FIG. 8.

FIG. 9 shows an example of the arrangement of the components of the semiconductor device 100, including discharge elements 101, driving units 102, the power supply wiring line 104, the ground wiring line 105, the power supply terminal 106, and the ground terminal 107. In FIG. 9, control circuits 103 are not illustrated for the sake of descriptive simplicity. The semiconductor device 100 is, for example, formed on a substrate 303 (semiconductor substrate) using a silicon substrate or the like using a multilayer wiring technique. The plurality of discharge units UNIT each including the discharge element 101 and the driving unit 102 is arranged in a matrix on the substrate 303. Additionally, liquid supply ports 304 configured to supply a liquid to the discharge elements 101 are arranged on the substrate 303.

The vertical direction in FIG. 9 will be referred to as a column direction 311 (first direction), and a direction crossing the column direction 311 as a row direction 312 (second direction) here. The plurality of discharge units UNIT is arranged in parallel in the column direction 311 and in the row direction 312. The substrate 303 includes a side 307 (first side) and a side 308 (second side) parallel to the column direction 311, and also includes a side 305 (third side) and a side 306 (fourth side) parallel to the row direction 312. The sides adjacent to each other may be connected to each other, as shown in FIG. 9, or may be connected via a chamfered portion having a linear or arc shape. The interior angle (apex 301) between the side 305 and the side 307 is an obtuse angle, and the interior angle (apex 302) between the side 305 and the side 308 is an acute angle. Additionally, for example, if the sides adjacent to each other are connected via a chamfered portion, the interior angle between the extension line of the side 305 and the extension line of the side 307 is an obtuse angle, and the interior angle between the extension line of the side 305 and the extension line of the side 308 is an acute angle. In this embodiment, the parallelogrammic substrate 303 in which the sides 305 and 306 are not orthogonal to the sides 307 and 308 is used. However, the shape of the substrate 303 is not limited to this. For example, the substrate 303 may have a rectangular shape in which the sides 305 and 306 are orthogonal to the sides 307 and 308.

The power supply terminal 106 connected to the power supply wiring line 104 and the ground terminal 107 connected to the ground wiring line 105 are arranged close to the side 305. A terminal unit T including the power supply terminal 106 and the ground terminal 107 is arranged between the side 305 and the region where the discharge units UNIT are arranged. In this embodiment as well, the terminal unit T including the power supply terminal 106 and the ground terminal 107 is arranged to be adjacent to one side of the region where the discharge units UNIT are arranged. A power supply voltage and a ground voltage are supplied from a power supply (not shown) arranged outside the semiconductor device 100 to the power supply terminal 106 and the ground terminal 107, respectively, thereby supplying power to the discharge units UNIT via the power supply wiring line 104 and the ground wiring line 105.

In this embodiment, the plurality of discharge units UNIT is arranged in 4 rows×32 columns between the terminal unit T and the side 306 and between the side 307 and the side 308. One liquid supply port 304 is arranged for every two discharge elements 101. For this reason, the liquid supply ports 304 may be arranged tightly in the row direction 312. The number of discharge units UNIT arranged is not limited to 4 rows×32 columns, and may be smaller than 4 rows×32 columns or larger than 4 rows×32 columns. One liquid supply port 304 may be arranged for each discharge element 101, or one liquid supply port may be arranged for every three or more discharge elements 101.

The power supply wiring line 104 may be formed using, for example, a metal wiring line (the metal wiring line may be made of a metal such as aluminum or an alloy thereof) of the second layer so as to pass on the discharge units UNIT. The ground wiring line 105 may be formed using, for example, a metal wiring line (the metal wiring line may be made of a metal such as aluminum or an alloy thereof) of the third layer so as to pass on the discharge units UNIT. Each of the power supply wiring line 104 and the ground wiring line 105 can typically have a fixed thickness.

In this embodiment, to reduce the wiring resistances of the power supply wiring line 104 and the ground wiring line 105, the wiring lines are arranged on the entire substrate. For this reason, the power supply wiring line 104 and the ground wiring line 105 have a multilayer wiring structure and are arranged to stack on each other. The power supply wiring line 104 and the ground wiring line 105 are arranged while avoiding the liquid supply ports 304. The liquid supply ports 304 are arranged in 4 rows×16 columns in correspondence with the discharge elements 101. Hence, the power supply wiring line 104 and the ground wiring line 105 can have lattice-shaped wiring patterns.

The discharge units UNIT will be referred to as the discharge units UNIT of the first row, the discharge units UNIT of the second row, . . . sequentially from the side to arrange the terminal unit T (the side of the side 305) here. In the arrangement shown in FIG. 9, the discharge units UNIT closest to the side 306 are the discharge units UNIT of the fourth row. In addition, the discharge units UNIT will be referred to as the discharge units UNIT of the first column, the discharge units UNIT of the second column, . . . sequentially from the side of the side 307. In the arrangement shown in FIG. 9, the discharge units UNIT closest to the side 308 are the discharge units UNIT of the 32nd column.

Referring to FIG. 9, the region where the discharge units UNIT of the first row are arranged is defined as region A, the region where the discharge units UNIT of the second row are arranged is defined as region B, and the region where the discharge units UNIT of the third and fourth rows are arranged is defined as region C. In this embodiment, the resistance of the driving unit 102 is changed in regions A to C in consideration of a wiring resistance RVH of the power supply wiring line 104 and a wiring resistance RGNDH of the ground wiring line 105. More specifically, the layout is done such that an ON resistance RON of the transistors of the driving units 102 arranged on the row whose distance from the terminal unit T is long becomes lower than the ON resistance RON of the transistors of the driving units 102 arranged on the row whose distance from the terminal unit T is small. For example, as shown in FIG. 10, the ON resistance RON of the transistors of the driving units 102 is set to lower stepwise on a row basis in the order of regions A, B, and C as the distance from the terminal unit T increases. In addition, the discharge units UNIT arranged in the row direction 312 can have the same ON resistance RON. This makes it possible to reduce the difference between the maximum value and the minimum value of the total resistance value of the wiring resistances of the power supply wiring line 104 and the ground wiring line 105 and the ON resistance RON of the transistors of the driving units 102 and reduce the variation in the voltage applied to the discharge elements 101. In this embodiment, the entire region is divided into three regions, and the resistance of the transistors of the driving units 102 is changed to change the drivability in the regions. However, the present invention is not limited to this. For example, one region may be formed by the discharge units UNIT of the first and second rows, another region may be formed by the discharge units UNIT of the third and fourth rows, and the resistance of the transistors of the driving units 102 may be changed on a region basis. Alternatively, for example, the resistance of the transistors of the driving units 102 may be changed on a row basis.

FIG. 11 shows the total resistance value of the wiring resistance RVH of the power supply wiring line 104, the wiring resistance RGNDH of the ground wiring line 105, and the ON resistance RON of the transistors of the driving units 102 in a case in which the ON resistance RON of the transistors of the driving units 102 is reduced in the order of regions A, B, and C. The abscissa represents the column number, and the ordinate represents the resistance value. The total resistance value is shown on a row basis. As is apparent from FIG. 11, the difference between the maximum value and the minimum value of the total resistance value is 0.24 Ω. Meanwhile, FIG. 12 shows the total resistance value of the wiring resistance RVH of the power supply wiring line 104, the wiring resistance RGNDH of the ground wiring line 105, and the ON resistance RON of the transistors of the driving units 102 in a case in which the same transistor is used in all driving units 102 as a comparative structure to this embodiment. As in FIG. 11, the abscissa represents the column number, the ordinate represents the resistance value, and the total resistance value is shown on a row basis. The difference between the maximum value and the minimum value of the total resistance value is 0.39 Ω, which is larger than 0.24 Ω in this embodiment. When the arrangement according to this embodiment is used, the variation in the sum of the wiring resistances RVH and RGNDH and the ON resistance of the transistors inserted in the current path of each discharge unit UNIT between the power supply terminal 106 and the ground terminal 107 can be reduced as compared to a conventional structure. It is therefore possible to reduce the variation in the voltage applied to the discharge elements 101 and improve the image quality of a formed image.

As described above, even in a layout in which the wiring line shape or the arrangement of the power supply terminal and the ground terminal causes a variation in the voltage applied to the discharge elements 101, the variation can be reduced by the ON resistance RON of the transistors of the driving units 102. For example, the lattice-shaped wiring lines and the arrangement with the power supply terminal 106 and the ground terminal 107 arranged only on the side of the side 305, as shown in FIG. 9, can be employed. Accordingly, in the semiconductor device 100 of this embodiment, it is possible to reduce the restriction on the layout of the wiring lines and the terminal unit while reducing the variation in the voltage applied to the discharge elements 101.

Additionally, in this embodiment, to change the resistance of the transistors used in the driving units 102, the size of the transistors is changed. In the region where the ON resistance RON of the transistors of the driving units 102 is high, a channel width W can be decreased, and therefore, the formation region of the transistor in each driving unit 102 can be made small. As a result, in regions A and B, the distance between the discharge units UNIT arranged in the row direction 312 can be made shorter than in the comparative structure. It is consequently possible to implement size reduction of the semiconductor device 100, as in the above-described embodiments. Additionally, as in the above-described embodiments, it is possible to suppress supply of a large current to the discharge elements 101 arranged in the region where the resistance values of the wiring resistances RVH and RGNDH are small and suppress shortening of the life of a specific discharge element 101 caused by an increase in the heat generation amount.

Figure 13:
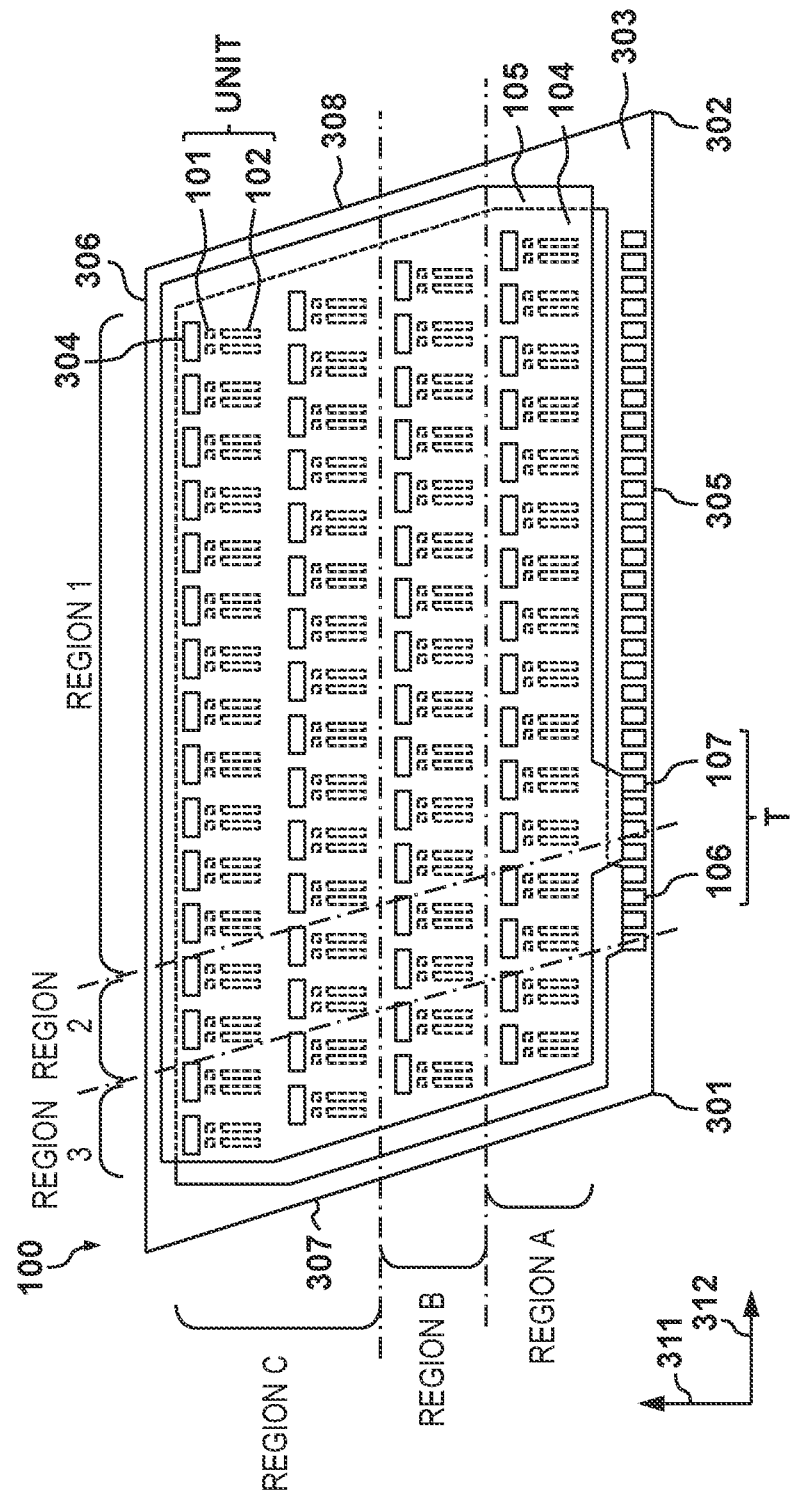
FIG. 13 is a view showing an example of the arrangement of the components of a semiconductor device according to still another embodiment of the present invention.
Figures 14, 15:
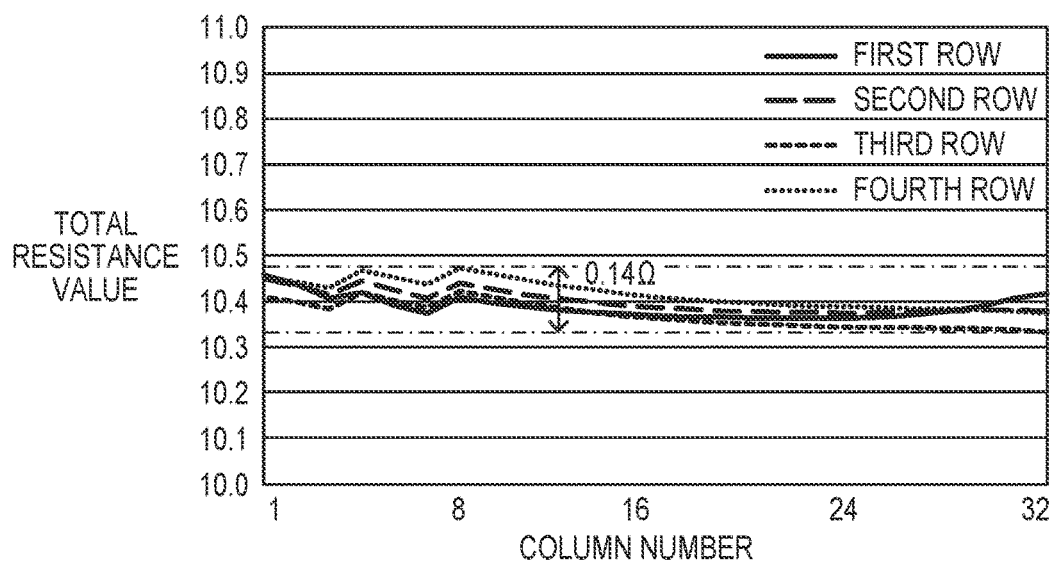
FIG. 14 is a table showing an example of the magnitude relationship of the resistance values of the driving units of the semiconductor device shown in FIG. 13.
FIG. 15 is a graph showing an example of resistance values included in paths via the discharge units of the semiconductor device shown in FIG. 13.

The structure of a semiconductor device according to still another embodiment of the present invention will be described with reference to FIGS. 13 to 15. FIG. 13 is a circuit diagram showing an example of the arrangement of the components of a semiconductor device 100 according to a fourth embodiment of the present invention. This embodiment is different from the above-described third embodiment in that the drivability of the transistors of driving units 102 is changed not only in a row direction 312 but also in a column direction 311. The rest of the arrangement may be the same as in the above-described third embodiment.

Referring to FIG. 13, the region where discharge units UNIT of the first to fourth columns are arranged is defined as region 3, the region where discharge units UNIT of the fifth to eighth columns are arranged is defined as region 2, and the region where discharge units UNIT of the ninth to 32nd columns are arranged is defined as region 1. In this embodiment, the resistance of the driving unit 102 is changed for each region corresponding to a combination of regions A to C and regions 1 to 3 in consideration of a wiring resistance RVH of a power supply wiring line 104 and a wiring resistance RGNDH of a ground wiring line 105. More specifically, the layout is done such that the ON resistance of the transistor of the driving unit 102 whose distance from a side 307 is short and whose distance from a side 305 is long becomes lower than the ON resistance of the transistor of the driving unit 102 whose distance from the side 307 is long and whose distance from a side 305 is short. For example, as shown in FIG. 14, an ON resistance RON of the transistors of the driving units 102 is set to lower stepwise in the order of regions A, B, and C. In addition, if a parallelogrammic substrate 303 as shown in FIG. 13 is used, the resistance value of the wiring resistance rises as the distance from a terminal unit T increases in the column direction 311, and additionally, the wiring resistance becomes high near the side 307 that forms an obtuse interior angle (apex 301) together with the side 305 on which the terminal unit T is arranged. For this reason, as shown in FIG. 14, the ON resistance RON of the transistors of the driving units 102 is set to lower stepwise in the order of regions 1, 2, and 3. In other words, the ON resistance RON of the transistors of the driving units 102 increases continuously or stepwise as the distance from the side 307 to the discharge unit UNIT increases.

As for the method of changing the ON resistance RON of the transistors of the driving units 102, the drivability may be changed by changing a channel width W or a channel length L, as in the above-described embodiments. If transistors having the same channel width W and channel length L are used as the transistors of the driving units 102, a gate voltage Vgs applied to the transistors of the driving units 102 may be changed when driving the discharge elements 101.

The drivability of the transistors of the driving units 102 is changed not only in the column direction 311 but also in the row direction 312. With this arrangement, the difference between the maximum value and the minimum value of the total resistance value of the wiring resistance RVH of the power supply wiring line 104, the wiring resistance RGNDH of the ground wiring line 105, and the ON resistance RON of the transistors of the driving units 102 can be reduced to 0.14 Ω, as shown in FIG. 15. When the arrangement according to this embodiment is used, the variation in the sum of the wiring resistances and the ON resistance of the transistors inserted in the current path of each discharge unit UNIT between the power supply terminal 106 and the ground terminal 107 can further be reduced as compared to the above-described third embodiment. It is therefore possible to reduce the variation in the voltage applied to the discharge elements 101 and further improve the image quality of a formed image.

Four embodiments according to the present invention have been described above. However, the present invention is not limited to these embodiments, as a matter of course. The above-described embodiments can appropriately be changed or combined without departing from the scope of the present invention.

A printhead (liquid discharge head), a printhead cartridge (liquid discharge head cartridge), and an inkjet printing apparatus (printing apparatus) incorporating the above-described semiconductor device will exemplarily be described below.

Figure 16A:
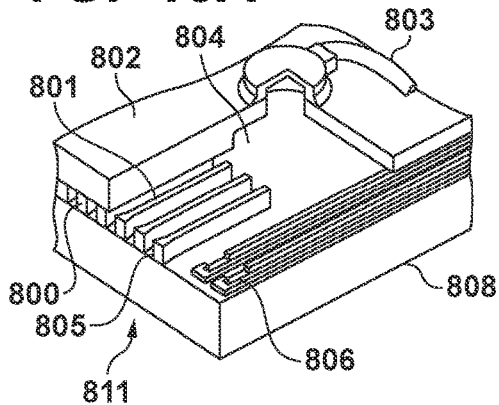
FIGS. 16A to 16D are views showing a liquid discharge head, a liquid discharge head cartridge, a printing apparatus, and the control circuit of the printing apparatus.

FIG. 16A shows the main part of a printhead 811 including a base 808 for a printhead incorporating the semiconductor device exemplarily described in the first to fourth embodiments. The above-described discharge element 101 is illustrated as a heating unit 806 here. As shown in FIG. 16A, channel wall members 801 used to form fluid channels 805 communicating with a plurality of discharge portions 800 and a top plate 802 with an ink supply port 803 are assembled to the base 808, thereby forming the printhead 811. In this case, ink injected from the ink supply port 803 is stored in an internal common ink chamber 804 and supplied to the fluid channels 805. The base 808 and the heating units 806 are driven in this state, thereby discharging the ink from the discharge portions 800.

Figure 16B:
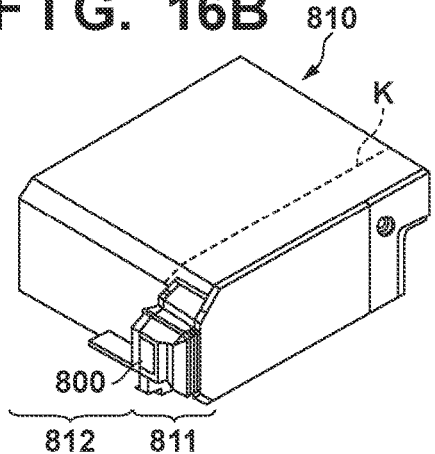

FIG. 16B is a perspective view showing the overall arrangement of a printhead cartridge 810 using the printhead 811. The printhead cartridge 810 includes the above-described printhead 811 including the plurality of discharge portions 800, and an ink tank 812 that holds the ink to be supplied to the printhead 811. The ink tank 812 is provided on the printhead 811 so as to be detachable at a boundary line K. The printhead cartridge 810 is provided with an electrical contact (not shown) configured to receive an electrical signal from the carriage side when the printhead cartridge is mounted on the printing apparatus shown in FIG. 16C. The heater is driven by the electrical signal. A fibrous or porous ink absorber is provided in the ink tank 812 to hold the ink, and the ink is held by the ink absorber.

It is possible to provide an inkjet printing apparatus in which the printhead cartridge 810 shown in FIG. 16B is mounted in the inkjet printing apparatus main body, and a signal supplied from the apparatus main body to the printhead 811 is controlled, thereby implementing high-speed, high-quality printing. The inkjet printing apparatus using the printhead cartridge 810 will be described below.

Figure 16C:
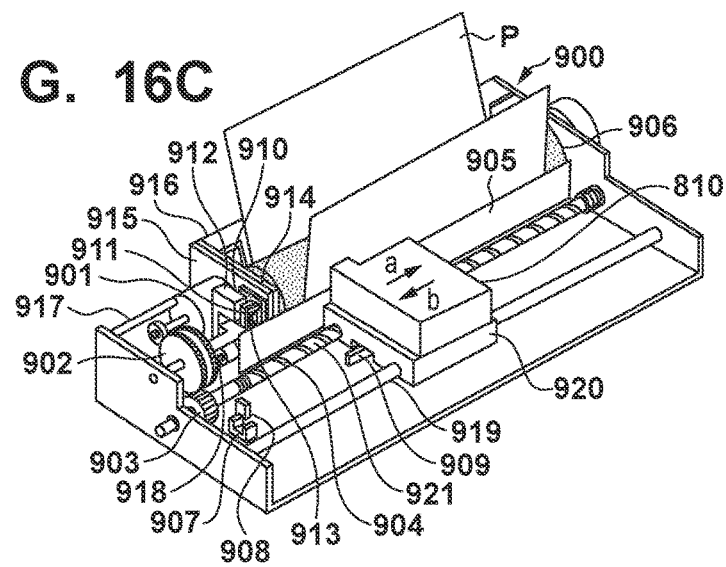

FIG. 16C is a perspective view showing the outer appearance of an inkjet printing apparatus 900 according to an embodiment of the present invention. Referring to FIG. 16C, the printhead cartridge 810 is mounted on a carriage 920 engaging with a helical groove 921 of a lead screw 904 that rotates, via driving force transmission gears 902 and 903, in synchronism with the forward/backward rotation of a drive motor 901. The printhead cartridge 810 can be moved along a guide 919 together with the carriage 920 reciprocally in the direction of an arrow a or b by the driving force of the drive motor 901. A paper press plate 905 for a printing paper sheet P conveyed onto a platen 906 by a printing medium feeder (not shown) presses the printing paper sheet P against the platen 906 along the carriage moving direction.

Photocouplers 907 and 908 are home position detection means for confirming the existence of a lever 909 provided on the carriage 920 in the region where the photocouplers 907 and 908 are provided and switching the rotation direction of the drive motor 901. A support member 910 supports a cap member 911 that caps the entire surface of the printhead cartridge 810. A suction means 912 sucks the interior of the cap member 911 and performs suction recovery of the printhead 811 of the printhead cartridge 810 via an intra-cap opening 913. A moving member 915 allows a cleaning blade 914 to move in the front-and-rear direction. The cleaning blade 914 and the moving member 915 are supported by a main body support plate 916. Not only the cleaning blade 914 of the illustrated form but also a known cleaning blade is applicable to the embodiment, as a matter of course. A lever 917 is provided to start suction of suction recovery. The lever 917 moves along with the movement of a cam 918 that engages with the carriage 920, and transmission of the driving force of the drive motor 901 is controlled by a known transmission means such as a clutch. A printing control unit (not shown) configured to give a signal to the heating units 806 provided in the printhead 811 of the printhead cartridge 810 and control driving of mechanisms such as the drive motor 901 is provided on the apparatus main body side.

In the inkjet printing apparatus 900 having the above-described arrangement, the printhead 811 of the printhead cartridge 810 performs printing on the printing paper sheet P conveyed onto the platen 906 by the printing medium feeder while reciprocally moving throughout in the widthwise direction of the printing paper sheet P. Since the printhead 811 is manufactured using a semiconductor device having the circuit structure of the above-described embodiments, accurate high-speed printing can be performed.

Figure 16D:
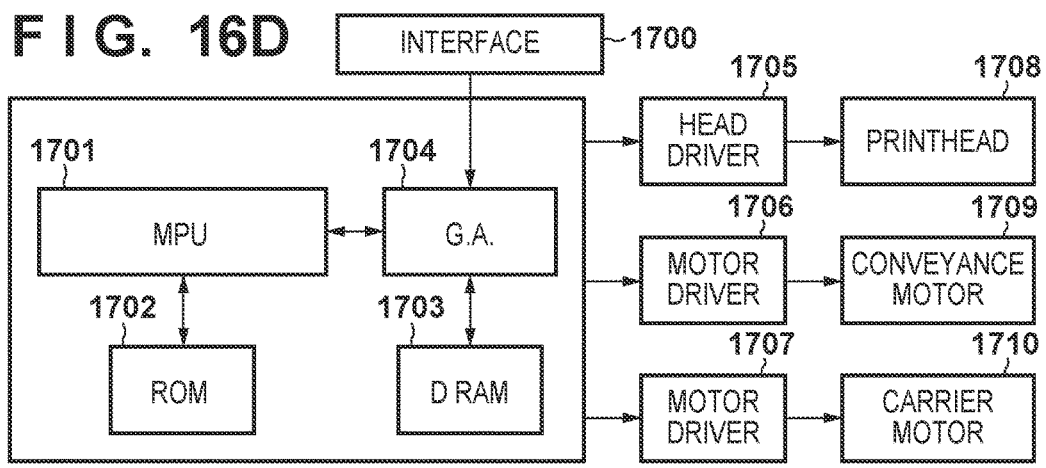

The arrangement of a control circuit configured to execute printing control of the above-described apparatus will be described next. FIG. 16D is a block diagram showing the arrangement of the control circuit of the inkjet printing apparatus 900. The control circuit includes an interface 1700 to which a print signal is input, an MPU (microprocessor) 1701, and a program ROM 1702 that stores a control program to be executed by the MPU 1701. The control circuit also includes a dynamic RAM (Random Access Memory) 1703 that stores various kinds of data (the print signal and print data to be supplied to the head), and a gate array 1704 that controls supply of print data to a printhead 1708. The gate array 1704 also controls data transfer between the interface 1700, the MPU 1701, and the RAM 1703. The control circuit also includes a carrier motor 1710 configured to convey the printhead 1708, and a conveyance motor 1709 configured to convey printing paper. The control circuit also includes a head driver 1705 that drives the printhead 1708, and motor drivers 1706 and 1707 configured to drive the conveyance motor 1709 and the carrier motor 1710, respectively.

The operation of the control configuration will be described. When a print signal is input to the interface 1700, the print signal is converted into print data for printing between the gate array 1704 and the MPU 1701. The motor drivers 1706 and 1707 are then driven, and simultaneously, the printhead is driven in accordance with the print data sent to the head driver 1705, thereby performing printing.

The present invention produces a great effect particularly in a printhead and a printing apparatus proposed by the present applicant, which use a method of discharging ink using thermal energy out of the inkjet printing methods. The present invention is usable in, for example, a printer, a copying machine, and a facsimile apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-139695, filed Jul. 14, 2016, which is hereby incorporated by reference herein in its entirety.

What is claimed is:

1. A semiconductor device comprising:
a plurality of discharge units each including a discharge element configured to discharge a liquid, and a driving unit configured to drive the discharge element; and
a terminal unit configured to supply power to each of the plurality of discharge units via a wiring line,
wherein the plurality of discharge units includes a first discharge unit and a second discharge unit,
the first discharge unit includes a first discharge element of the discharge elements and a first driving unit of the driving units,
the second discharge unit includes a second discharge element of the discharge elements and a second driving unit of the driving units,
a length of a current path from the terminal unit to the first discharge unit is longer than a length of a current path from the terminal unit to the second discharge unit, and
a resistance of the first driving unit is lower than a resistance of the second driving unit.

2. The device according to claim 1, wherein along with an increase in the length of the current path from the terminal unit to each of the plurality of discharge units, the resistances of the driving unit included in the respective discharge unit decrease continuously or stepwise.

3. The device according to claim 1, wherein the terminal unit includes a power supply terminal and a ground terminal.

4. The device according to claim 3, wherein a sum of a wiring resistance of the wiring line between the discharge unit and the power supply terminal, a wiring resistance of the wiring line between the discharge unit and the ground terminal, and a resistance of the driving unit included in the discharge unit is the same in the plurality of discharge units.

5. The device according to claim 1,
wherein the terminal unit includes a plurality of terminals, and
wherein the plurality of discharge units is arranged in a direction which is parallel to a direction in which the plurality of terminals is arranged.

6. The device according to claim 5, wherein
the first driving unit includes a first transistor,
the second driving unit includes a second transistor,
in the first discharge unit, the first driving unit and the first discharge element are connected in series between one terminal and the other terminal,
in the second discharge unit, the second driving unit and the second discharge element are connected in series between one terminal and the other terminal, the resistance of the first driving unit is an ON resistance of the first transistor, and the resistance of the second driving unit is an ON resistance of the second transistor.

7. The device according to claim 6, wherein in the first transistor and the second transistor,
at least one of a condition that a channel width of the first transistor is longer than a channel width of the second transistor or a condition that a channel length of the first transistor is shorter than a channel length of the second transistor is satisfied.

8. The device according to claim 6, wherein in the first transistor and the second transistor,
a gate voltage applied to the first transistor is higher than a gate voltage applied to the second transistor.

9. The device according to claim 6, wherein the wiring line includes a power supply wiring line configured to connect the power supply terminal to the one terminal of each of the plurality of discharge units, and a ground wiring line configured to connect the ground terminal to the other terminal of each of the plurality of discharge units.

10. The device according to claim 6, wherein the plurality of discharge units includes a plurality of discharge unit groups each including at least one of the plurality of discharge units,
the wiring line includes a plurality of power supply wiring lines configured to connect the power supply terminal to the one terminal of each of discharge units included in a discharge unit group of the plurality of discharge unit groups, and a plurality of ground wiring lines configured to connect the ground terminal to the other terminal of each of discharge units included in a discharge unit group of the plurality of discharge unit groups,
the plurality of discharge unit groups includes a first discharge unit group and a second discharge unit group,
a length of a current path from the terminal unit to the first discharge unit group is longer than a length of a current path from the terminal unit to the second discharge unit group, and
an average wiring resistance per unit length of a power supply wiring line and a ground wiring line connected to the first discharge unit group of the plurality of power supply wiring lines and the plurality of ground wiring lines is lower than an average wiring resistance per unit length of a power supply wiring line and a ground wiring line connected to the second discharge unit group of the plurality of power supply wiring lines and the plurality of ground wiring lines.

11. The device according to claim 6, wherein the plurality of discharge units is arranged to form a plurality of columns parallel to a first direction and a plurality of rows parallel to a second direction crossing the first direction, and
the wiring line includes a power supply wiring line configured to connect the power supply terminal to the one terminal of each of the plurality of discharge units, and a ground wiring line configured to connect the ground terminal to the other terminal of each of the plurality of discharge units.

12. The device according to claim 11, wherein each of the power supply wiring line and the ground wiring line has a lattice-shaped wiring pattern and is arranged to be stacked above the plurality of discharge units,
in the plurality of discharge units, resistances of the driving units included in the same row in the plurality of rows have values equal to each other,
the plurality of discharge units include a discharge unit included in a first row and a discharge unit included in a second row,
a distance from the terminal unit to the first row in the first direction is longer than a distance from the terminal unit to the second row in the first direction, and
a resistance of the driving unit included in each of the discharge units included in the first row is lower than a resistance of the driving unit included in each of the discharge units included in the second row.

13. The device according to claim 5, wherein
the first driving unit includes a first transistor and a third transistor,
the second driving unit includes a second transistor and a fourth transistor,
in the first discharge unit, the first transistor, the first discharge element, and the third transistor are connected in series in this order from one terminal to the other terminal,
in the second discharge unit, the second transistor, the second discharge element, and the fourth transistor are connected in series in this order from one terminal to the other terminal,
the one terminal of the first discharge unit and the one terminal of the second discharge unit are connected,
the other terminal of the first discharge unit and the other terminal of the second discharge unit are connected,
the resistance of the first driving unit is an ON resistance of the first transistor and the third transistor,
the resistance of the second driving unit is an ON resistance of the second transistor and the fourth transistor, and
the ON resistance of the first transistor is lower than the ON resistance of the second transistor, and the ON resistance of the third transistor is lower than the ON resistance of the fourth transistor.

14. A semiconductor device comprising:
a plurality of discharge units arranged on a substrate including a first side and a second side parallel to a first direction and a third side and a fourth side parallel to a second direction crossing the first direction, and each including a discharge element configured to discharge a liquid, and a driving unit configured to drive the discharge element; and
a terminal unit arranged, in the first direction, between the third side and a region where the plurality of discharge units is arranged, and including a power supply terminal and a ground terminal each configured to supply power to each of the plurality of discharge units via a wiring line,
wherein the first direction and the second direction are not orthogonal to each other,
an interior angle of an apex formed by one of the first side or an extension line of the first side, and one of the third side or an extension line of the third side is an obtuse angle,
the wiring line includes a power supply wiring line configured to connect the power supply terminal to one terminal of each of the plurality of discharge units, and a ground wiring line configured to connect the ground terminal to the other terminal of each of the plurality of discharge units,
each of the power supply wiring line and the ground wiring line has a lattice-shaped wiring pattern and is arranged to be stacked on the plurality of discharge units, the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a distance from the first discharge unit to the third side is longer than a distance from the second discharge unit to the third side, and a resistance of the first driving unit is lower than a resistance of the second driving unit.

15. A liquid discharge head comprising a discharge portion configured to discharge a liquid and a semiconductor device arranged to control the discharge of the liquid from the discharge portion, the semiconductor device comprising:

a plurality of discharge units each including a discharge element configured to discharge a liquid, and a driving unit configured to drive the discharge element; and a terminal unit configured to supply power to each of the plurality of discharge units via a wiring line, wherein the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a length of a current path from the terminal unit to the first discharge unit is longer than a length of a current path from the terminal unit to the second discharge unit, and a resistance of the first driving unit is lower than a resistance of the second driving unit.

16. A liquid discharge head cartridge comprising a liquid discharge head and a container configured to hold a liquid, the liquid discharge head comprising a discharge portion configured to discharge a liquid and a semiconductor device arranged to control the discharge of the liquid from the discharge portion, the semiconductor device comprising:

a plurality of discharge units each including a discharge element configured to discharge a liquid, and a driving unit configured to drive the discharge element; and a terminal unit configured to supply power to each of the plurality of discharge units via a wiring line, wherein the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a length of a current path from the terminal unit to the first discharge unit is longer than a length of a current path from the terminal unit to the second discharge unit, and a resistance of the first driving unit is lower than a resistance of the second driving unit.

17. A printing apparatus in which a liquid discharge head cartridge is mounted, the liquid discharge head cartridge comprising a liquid discharge head and a container configured to hold a liquid, the liquid discharge head comprising a discharge portion configured to discharge a liquid and a semiconductor device arranged to control the discharge of the liquid from the discharge portion, the semiconductor device comprising:

a plurality of discharge units each including a discharge element configured to discharge a liquid and a driving unit configured to drive the discharge element; and a terminal unit configured to supply power to each of the plurality of discharge units via a wiring line, wherein the plurality of discharge units includes a first discharge unit and a second discharge unit, the first discharge unit includes a first discharge element of the discharge elements and a first driving unit of the driving units, the second discharge unit includes a second discharge element of the discharge elements and a second driving unit of the driving units, a length of a current path from the terminal unit to the first discharge unit is longer than a length of a current path from the terminal unit to the second discharge unit, and a resistance of the first driving unit is lower than a resistance of the second driving unit.

* * * * *